United States Patent
Michel et al.

(10) Patent No.: US 9,985,147 B2
(45) Date of Patent: May 29, 2018

(54) LIGHT-REFLECTING GRATING STRUCTURE FOR PHOTOVOLTAIC DEVICES

(71) Applicants: International Business Machines Corporation, Armonk, NY (US); Egypt Nanotechnology Center, Giza (EG)

(72) Inventors: Bruno Michel, Rueschlikon (CH); Nikolaj Moll, Rueschlikon (CH); Rami Ghannam, Rueschlikon (CH)

(73) Assignees: INTERNATIONAL BUSINESS MACHINES CORPORATION, Armonk, NY (US); EGYPT NANOTECHNOLOGY CENTER, Giza (EG)

( * ) Notice: Subject to any disclaimer, the term of this patent is extended or adjusted under 35 U.S.C. 154(b) by 542 days.

(21) Appl. No.: 14/013,115

(22) Filed: Aug. 29, 2013

(65) Prior Publication Data
US 2014/0060642 A1    Mar. 6, 2014

(30) Foreign Application Priority Data
Aug. 29, 2012    (GB) .................................. 1215344.1

(51) Int. Cl.
H01L 31/0232    (2014.01)
H01L 31/0216    (2014.01)
H01L 31/056    (2014.01)

(52) U.S. Cl.
CPC .. H01L 31/02327 (2013.01); H01L 31/02168 (2013.01); H01L 31/056 (2014.12); Y02E 10/52 (2013.01)

(58) Field of Classification Search
CPC ....................................................... H01L 31/056
USPC ........................................................ 136/256
See application file for complete search history.

(56) References Cited

U.S. PATENT DOCUMENTS

| 4,493,942 A * | 1/1985 | Sheng et al. ................ 136/259 |
| 6,731,351 B2 | 5/2004 | Platz et al. |
| 7,968,790 B2 | 6/2011 | Raymond et al. |
| 2003/0029496 A1* | 2/2003 | Wada .................... B82Y 20/00 136/256 |
| 2005/0238310 A1* | 10/2005 | Hoshi .................... H01S 5/426 385/129 |
| 2009/0250110 A1 | 10/2009 | Yu et al. |

(Continued)

OTHER PUBLICATIONS

Mutitu, et al., Optics Express, 2008, vol. 16, No. 19, pp. 15238-15248.*

(Continued)

*Primary Examiner* — Sadie White
(74) *Attorney, Agent, or Firm* — Cantor Colburn LLP; Keivan Razavi

(57) ABSTRACT

A photovoltaic cell includes an absorbing layer configured to generate electron-hole pairs from incident photons of incoming light; and a first grating layer arranged at a first surface of the absorbing layer which is opposite to a second surface of the absorbing layer from which light is incident, wherein the first grating layer includes at least one grating extending along the first surface, wherein the at least one grating has grating structures which are dimensioned to provide a reflectivity for light incident through the absorbing layer back into the absorbing layer.

16 Claims, 10 Drawing Sheets

(56) References Cited

U.S. PATENT DOCUMENTS

| | | |
|---|---|---|
| 2009/0266413 A1 | 10/2009 | Mathai et al. |
| 2010/0065102 A1 | 3/2010 | Yuan |
| 2011/0030773 A1 | 2/2011 | Branz et al. |
| 2011/0048519 A1 | 3/2011 | Kizilyalli et al. |
| 2011/0197959 A1 | 8/2011 | Catchpole et al. |
| 2011/0203663 A1* | 8/2011 | Prather et al. ............... 136/259 |
| 2012/0006404 A1* | 1/2012 | Iizuka et al. ............... 136/259 |

OTHER PUBLICATIONS

Z. Yu et al. "Fundamental Limit of Light Trapping in Grating Structures, " Optics Express, vol. 18, Issue S3, pp. A366-A380, 2010.

J. N. Munday et al., "Large Integrated Absorption Enhancement in Plasmonic Solar Cells by Combining Metallic Gratings and Antireflection Coatings," Nano Letters, ACS Publications 2011, 11 (6), pp. 2195-2201, Oct. 14, 2010.

James G. Mutitu, et al., "Angular Selective Light Filter Based on Photonic Crystals for Photovoltaic Applications," IEEE photonics Journal, vol. 2, No. 2, Jun. 2010, pp. 1-11.

S. H. Zaidi et al., "Diffraction Grating Structures in Solar Cells, " Photovoltaic Specialists' Conference, 2000, IEEE, Aug. 2002, pp. 395-398.

G. Kiziltas, et al. ,"Automating the Design of a Band-Pass Spectral Filter With Frequency Selective Surfaces on Inhomogeneous Substrates," International Symposium on Electromagnetic Theory,(Invited Paper), URSI EMT-S, Pisa, Italy., May 2004, pp. 1-3.

* cited by examiner

LIGHT-REFLECTING GRATING STRUCTURE FOR PHOTOVOLTAIC DEVICES

PRIORITY

This application claims priority to Great Britain Patent Application No. 1215344.1, filed Aug. 29, 2012, and all the benefits accruing therefrom under 35 U.S.C. § 119, the contents of which in its entirety are herein incorporated by reference.

BACKGROUND

The present invention relates to non-crystalline photovoltaic cells such as amorphous silicon or thin-film photovoltaic cells. In particular, the present invention relates to measures for improving the absorption of incoming photons within the photovoltaic absorbing layer.

Solar photovoltaic cells made of crystalline or multi-crystalline semiconductor material, such as silicon, are dominating the market. Such cells have a photon absorbing layer with a thickness of 200 to 400 μm, so that a substantial amount of high-quality silicon material is used for their fabrication. One approach to reduce costs for the production of photovoltaic cells provides solar cell structures that require less high-quality (crystalline) silicon material. However, due to the poor absorption properties of silicon, in particular at wavelengths lower than λ=800 nm, a reduced thickness of the absorbing layer also means a significant reduction in the amount of light absorption and hence a lower output power of such photovoltaic cells.

Reducing or avoiding the use of high-quality silicon material leads to absorbing layers made of amorphous silicon or thin-film material. These solar cell structures can have a substantially reduced thickness which improves the collection efficiency of electron-hole pairs, and, in case of amorphous silicon cells, reduced degradation effects.

In order to improve the efficiency, a number of different topologies for photovoltaic cells have been proposed. In document US 2010/0065102, a photovoltaic device has a structure made of a first surface on a first column and a second surface on a second column which are applied with a first and second light absorption media, respectively. The surfaces form a resonance cavity that can trap incident light to enhance light absorption.

From document US 2011/0197959 A1 a photovoltaic cell is known that has a thin-film semiconducting layer provided on a support substrate, wherein a plasmon resonance-generating metallic structure is provided on the semiconducting layer for resonantly coupling light into the absorbing layer and transporting photo-induced charge carriers out of the absorbing layer.

In document US 2009/0266413 A1, there is described a photovoltaic cell whereon on a light absorption layer an electrode is disposed which is configured with a grating that enables light incident on the grating to be scattered into the light absorption layer and traps incident light with particular polarizations and incident angles in the grating to interact with the light absorption layer.

Document US 2011/0030773 teaches that for thin-film photovoltaic cells some wavelengths are not absorbed well by the absorbing layer as much of the red and infrared light simply passes through. In particular, wavelengths of between 550 and 900 nm should be reflected back into the absorbing layers to increase the absorption and hence the conversion efficiency of the cell. Therefore, it is proposed to structure the metal substrate on which the absorbing layer is provided.

Document US 2011/0048519 discloses a photovoltaic device with an increased light trapping using a front side light trapping and a back side light trapping. A diffuser is provided to diffuse scattered photons that pass through the absorbing layer without being absorbed. Furthermore, it may be provided that an emitter layer on the backside of the photovoltaic cell is roughened or textured in order to increase the light trapping.

Document US 2009/0250110 A1 discloses a photovoltaic cell with forward scattering nanoparticles on its surface to forward scatter radiation that would otherwise be reflected away from the photoconversion material. Hence, the transmission of photons into the active semiconductor region of the photovoltaic device can be increased, wherein the increased transmission of photons results in a correspondingly increased optical absorption and photogeneration of electrical current. The range of wavelengths within which this effect occurs can be controlled via the structure and composition of the nanostructures.

Document S. H. Zaidi et al., "Diffraction Grating Structures in Solar Cells", Photovoltaic Specialists' Conference, 2000, IEEE, August 2002, pages 395 to 398, discloses a texturing of c-Si photovoltaic films. By using a wide range of 1D and 2D grating structures, the effective path length can be enhanced since the generation profile with the grating is a combination of different modes traveling at different angles.

Document J. N. Munday et al., "Large Integrated Absorption Enhancement in Plasmonic Solar Cells by Combining Metallic Gratings and Antireflection Coatings", Nano Letters, ACS Publications 2011, 11 (6), pages 2195 to 2201, Oct. 14, 2010, discloses that plasmonic gratings may lead to a large narrow-band absorption enhancement in photovoltaic cells.

Also in document Z. Yu et al., "Fundamental Limit of Light Trapping in Grating Structures", Optics Express, Volume 18, Issue S3, pages A366 to A380, 2010, it is disclosed that light-trapping schemes can be used to enhance absorption in photovoltaic cells. Light trapping can be accomplished by introducing random roughness on the surface of the cell.

In general, there are numerous approaches to increase the path length for photons in the absorbing layer.

SUMMARY

In one embodiment, a photovoltaic cell includes an absorbing layer configured to generate electron-hole pairs from incident photons of incoming light; and a first grating layer arranged at a first surface of the absorbing layer which is opposite to a second surface of the absorbing layer from which light is incident, wherein the first grating layer includes at least one grating extending along the first surface, wherein the at least one grating has grating structures which are dimensioned to provide a reflectivity for light incident through the absorbing layer back into the absorbing layer.

In another embodiment, a method of forming a photovoltaic cell includes configuring an absorbing layer to generate electron-hole pairs from incident photons of incoming light; and arranging a first grating layer at a first surface of the absorbing layer which is opposite to a second surface of the absorbing layer from which light is incident, wherein the first grating layer includes at least one grating extending along the first surface, wherein the at least one grating has grating structures which are dimensioned to provide a reflectivity for light incident through the absorbing layer back into the absorbing layer.

BRIEF DESCRIPTION OF THE SEVERAL VIEWS OF THE DRAWINGS

Exemplary embodiments of the present invention are described in more detail in conjunction with the accompanying drawings, in which.

DETAILED DESCRIPTION

Figure 1:
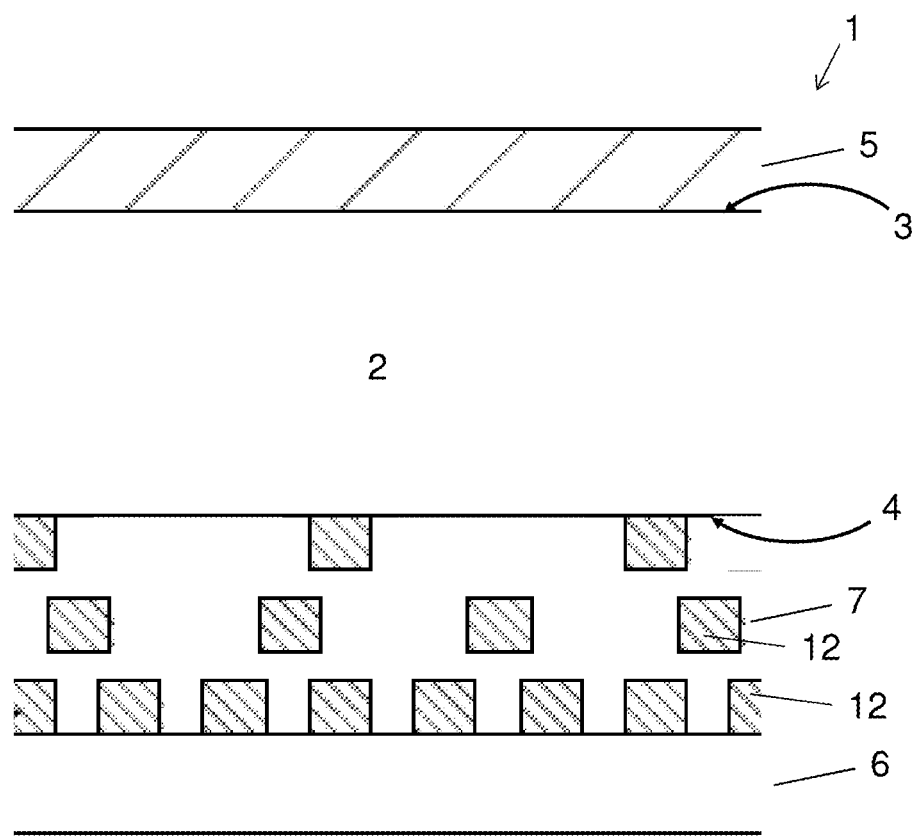
FIG. 1 shows a cross-sectional view through a thin-film photovoltaic cell having a back side multiple grating layer adapted for the reflection of different wavelength photons.

According to an embodiment of a first aspect of the invention there is provided a photovoltaic cell, including an absorbing layer configured to generate electron-hole pairs from incident photons of incoming light; a first grating layer arranged at a first surface of the absorbing layer which is opposite to a second surface of the absorbing layer from which light is incident, wherein the grating layer includes at least one grating extending along the first surface wherein the at least one grating has grating structures which are dimensioned to provide a reflectivity back into the absorbing layer.

One idea of the above photovoltaic cell is to provide a reflection means on the absorbing layer which has one or more stacked gratings which are configured to serve to incline or to deflect the incoming light beam of a specific wavelength range in which the material of the absorbing layer provides low absorption characteristics. This results in an increased path length of light beams within the absorbing material such that the likelihood that even photons at wavelengths at which the absorbing layer has a low absorption characteristics is essentially increased.

Furthermore, the first grating layer may be formed as a multiple grating layer which has a number of gratings stacked in a direction perpendicular to the surface of the absorbing layer.

It may be provided that the gratings of the first grating layer each have grating structures which differ in its dimensions to allow different ranges of wavelength to be reflected into the absorbing layer. Moreover, the gratings may be configured to provide wavelength ranges of reflectivity which overlap and/or adjoin each other to provide reflectivity in a wavelength range which can be absorbed by the absorbing layer.

It may be provided that the reflectivity of the first grating layer is adapted to a wavelength range which has an average absorption rate in the absorbing layer which is lower than the absorption rate in the absorbing layer for all wavelengths of the incident photons.

According to an embodiment a second grating layer may be arranged at a second surface of the absorbing layer, wherein the second grating layer includes at least one grating with grating structures which are dimensioned to provide a transmission of incident light into the absorbing layer. Moreover, the second grating layer may be formed as a multiple grating layer which has a number of gratings stacked in a direction perpendicular to the surface of the absorbing layer.

The gratings of the second grating layer may each have grating structures which differ in its dimensions to allow different ranges of wavelength to enter the absorbing layer thereby allowing a resonance between the respective gratings of the first and second grating layer. Further, the first grating layer may be provided with a reflective layer on a surface which is opposing the absorbing layer.

Moreover, the first grating layer and/or the second grating layer have gratings wherein the grating structures are embedded in a support layer wherein the grating structures of the gratings differ in at least one of spacing, thickness, size in at least one direction parallel to the first or second surface, respectively, and shape. In particular, the grating structures may have a square, rectangular, circular, annular or elliptic shape.

FIG. 1 shows a cross-sectional view through a portion of a thin-film photovoltaic cell 1 having an absorbing layer 2. The absorbing layer 2 has a front side 3 (second surface) on which photons are incident and a back side 4 (first surface) which is on a side facing a supporting substrate 6 or opposing the front side 3 with respect to the absorbing layer 2, respectively.

The absorbing layer 2 may be made of a thin-film material, such as amorphous silicon or other known photovoltaic materials, and is configured to produce electron-hole pairs in response to incident light, as is well-known in the art.

Onto the front side 3 of the absorbing layer 2, an antireflective coating 5 may be applied in order to reduce the reflection rate of the surface of the absorbing layer 2 of the photovoltaic cell 1, thereby allowing most of the incoming photons to enter the absorbing layer 2.

Figure 2:
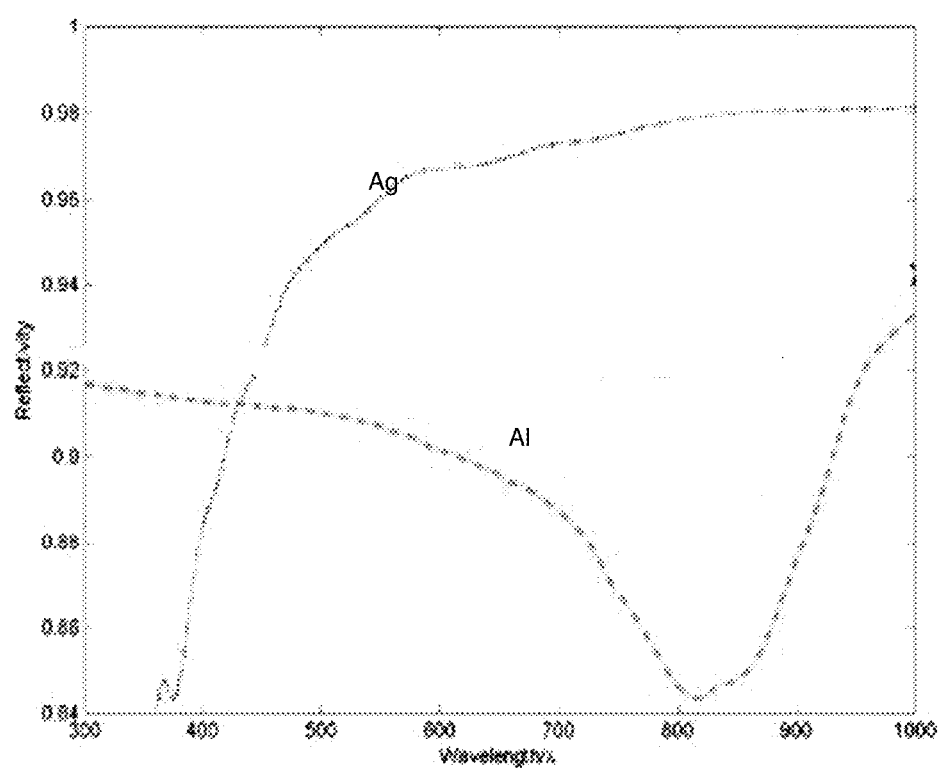
FIG. 2 shows a wavelength reflectivity diagram for materials Al and Ag conventionally used as a common plain reflection layer for standard photovoltaic cells.

Usually, reflective layers made of Al or Ag are provided on the back side 4 of the absorbing layer 2, which provide reflectivity for a reasonable portion of the wavelength of incident light, generally daylight. However, as shown in FIG. 2, the reflectivity for Aluminum (Al) drops significantly from 700 nm to 950 nm and the reflectivity for silver (Ag) is low at wavelengths lower than 420 nm, thereby discarding both a large portion of the useful wavelength range of daylight. The absorption of the non-reflective wavelengths in such a reflective layer results in an increase in temperature of the absorbing layer 2, which should be avoided in photovoltaic cells 1 since it may result in a degradation of performance.

Another method of reflecting light back into an absorbing layer 2 of the photovoltaic cell 1, as proposed herein, involves using a grating layer 7 (first grating layer) comprising high-contrast grating structures 12. The grating structures 12 are regularly arranged in a plane to provide a transmission and reflection characteristic for light incident on the surface of the plane. The transmission and reflection characteristic strongly depends on the wavelength of incoming photos. So the grating structures 12 can form a wideband reflective filter as illustrated in an example of single layer grating 10 shown in FIG. 3. Unless otherwise mentioned, the grating can be provided as a 1D grating having a spacing only in one dimension or as a 2D grating having a spacing in two dimensions. While the 1D grating provides a reflectivity for one polarization the 2D grating is appropriate to reflect light of both TE and TM polarizations.

Substantially, using a grating as a reflective means to reflect a light beam passing through the absorbing layer 2 has the advantage that the reflection is not total. The grating provides a selectivity for one or more specific wavelength ranges which may be selected so as to be in wavelength ranges where the absorbing characteristics of the absorbing layer material are low. In particular, for one grating the wavelength range can be selected at a wavelength range in which the absorbing characteristics of the absorbing layer are below average for the total usable range of the daylight which is between 400 and 1300 nm.

Figure 3:
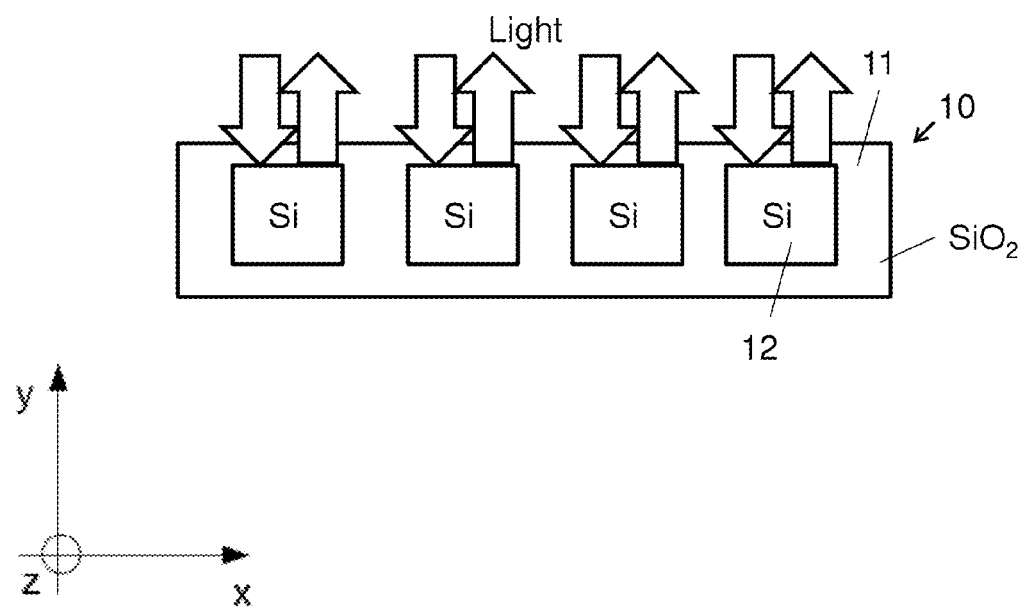
FIG. 3 shows a cross-sectional view through a single grating layer to illustrate spacing and height of the grating structures embedded.

Assuming a 1D grating 10 in FIG. 3, high-contrast grating structures are provided which make use of materials of different refractive indices, such as Si and $SiO_2$. Generally, the gratings as used herein have grating structures 12 which are regularly embedded in a support layer 11, wherein the materials of the grating structures 12 and the support layer 11 are selected with different refractive indices. Particularly, the grating 10 is formed in a $SiO_2$ support layer 11 wherein lines of Si as grating structures 12 with a rectangular cross-section are evenly embedded. The lines of Si are equally spaced lines (1D grating). For 2D gratings dot-like, rectangular-shaped, circular-shaped or elliptic-shaped structures of Si may be embedded in the $SiO_2$ layer 11.

The phase retardation of the light waves passing through the different dielectric materials will vary from one another and will partially or completely cancel one another. When the path difference between the light from adjacent dielectric materials is equal to the wavelength, the waves will be in phase and constructive interference occurs.

Figure 4A:
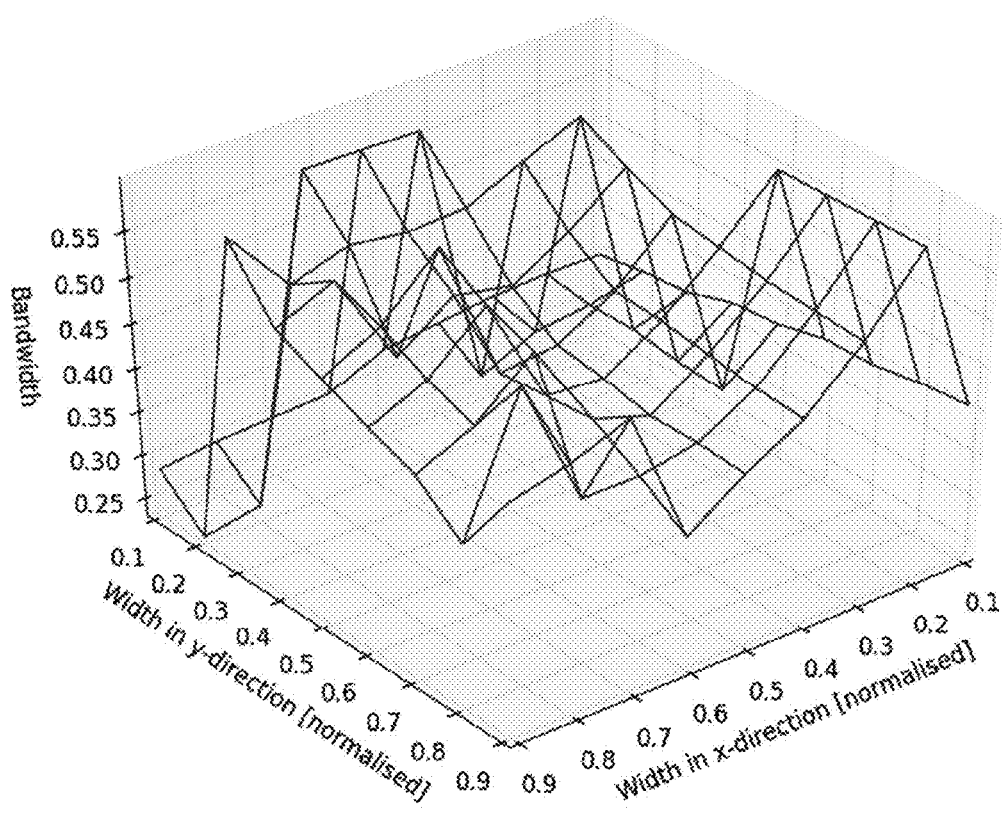
FIGS. 4A and 4B show a diagram illustrating the bandwidth and the transmission of an exemplary 1D grating structure for a different spacing and heights (thicknesses) of a grating.
Figure 4B:
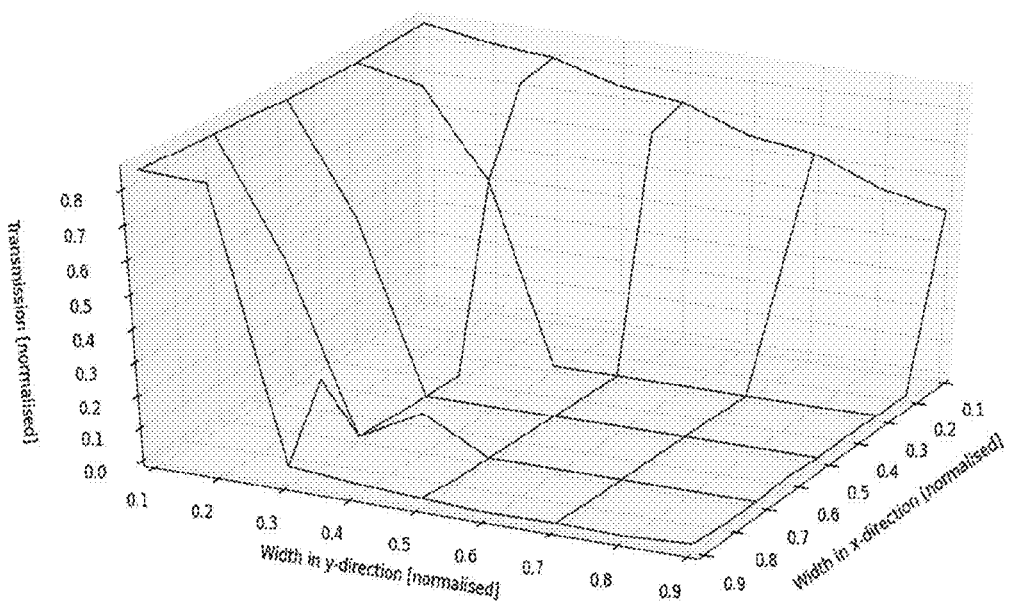

As shown in the diagrams of FIGS. 4A, and 4B for an example of an 1D grating with a spacing in x-direction (parallel to the back side) and thickness (perpendicular to the back side) in y-direction, the bandwidth and the transmission characteristics of such a grating structure is illustrated for a different spacing and heights (thicknesses) of the grating. It can be seen that for an 1D grating structure an optimization of the bandwidth and reflectivity can be obtained by optimizing the dimensions of the grating structures in x and y directions. The result for a 1D grating structure using Si and $SiO_2$ as dielectric materials is x=0.7 and y=0.5 in relation to the wavelength, where a bandwidth of +/−0.18 of the considered wavelength and a reflectivity of almost 100% (transmission of 0%) is achieved. In other words, designing the 1D grating for a specific wavelength λ with dimensions provided by X=0.7λ and Y=0.5λ results in a bandwidth of (1−0.18)λ to (1+0.18)λ of reflectivity of the grating. The x, y and z values can differ depending on the shape of the grating structures, their spacing and the materials used.

Back to FIG. 1, the back side 4 of the absorbing layer 2 is provided with a multiple grating structure in which the stacked gratings have different dimensions with respect to their width (x-direction, z-direction) spacing and their height (y-direction), so as to provide an improved reflectivity in a wavelength range defined by the dimensions of the grating layers. The gratings of the grating layers may be configured so that their respective wavelength ranges (1−0.18)λ to (1+0.18)λ (bandwidths) of reflectivity overlap or adjoin to cover a desired wavelength range, e.g. the wavelength range of absorption in the absorbing layer 2.

Figure 5:
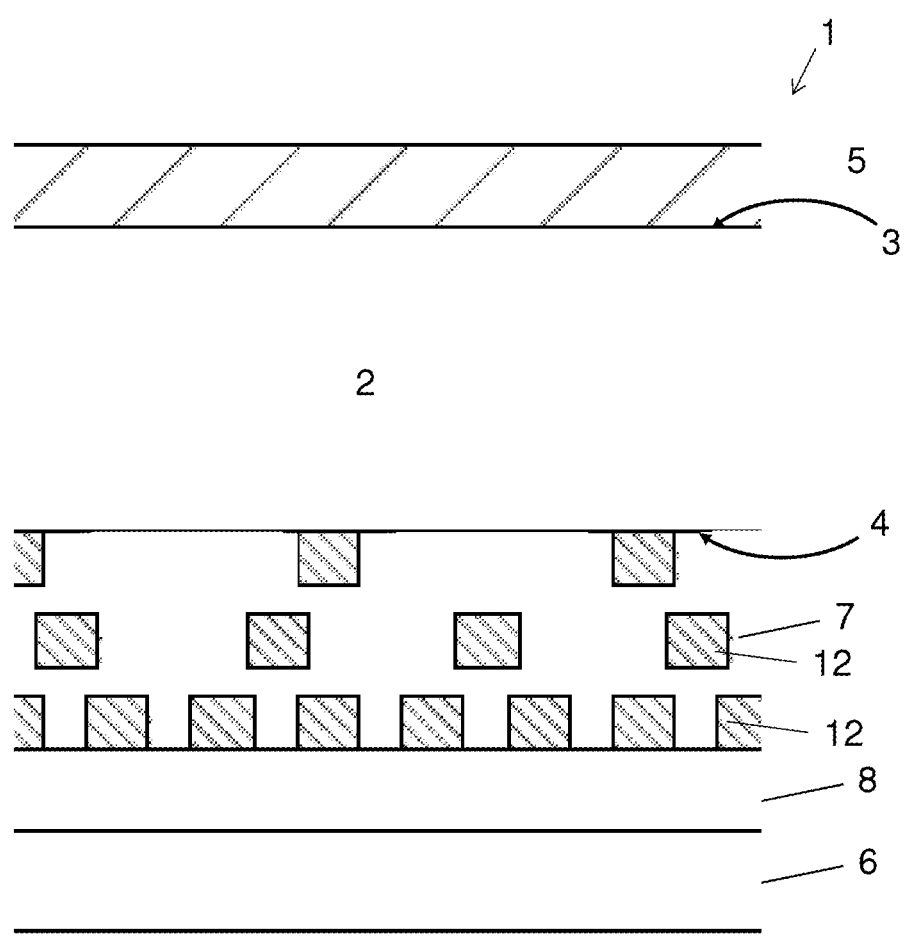
FIG. 5 shows a cross-sectional view of thin-film photovoltaic cell having a back side grating and a reflective layer 8 on the back side.

As shown in FIG. 5, the photovoltaic device 1 of FIG. 1 can be further applied with a reflective layer 8 on the back side of the multiple grating layer 7, i.e. between the substrate 6 and the absorbing layer 2. The reflective layer 8 can be made of metal such as Al and Ag in order to reflect light back into the absorbing layer 2 which was transmitted through the multiple grating layer 7, i.e. wavelengths of light different from the wavelength ranges of reflectivity of the multiple gratings.

Figure 6:
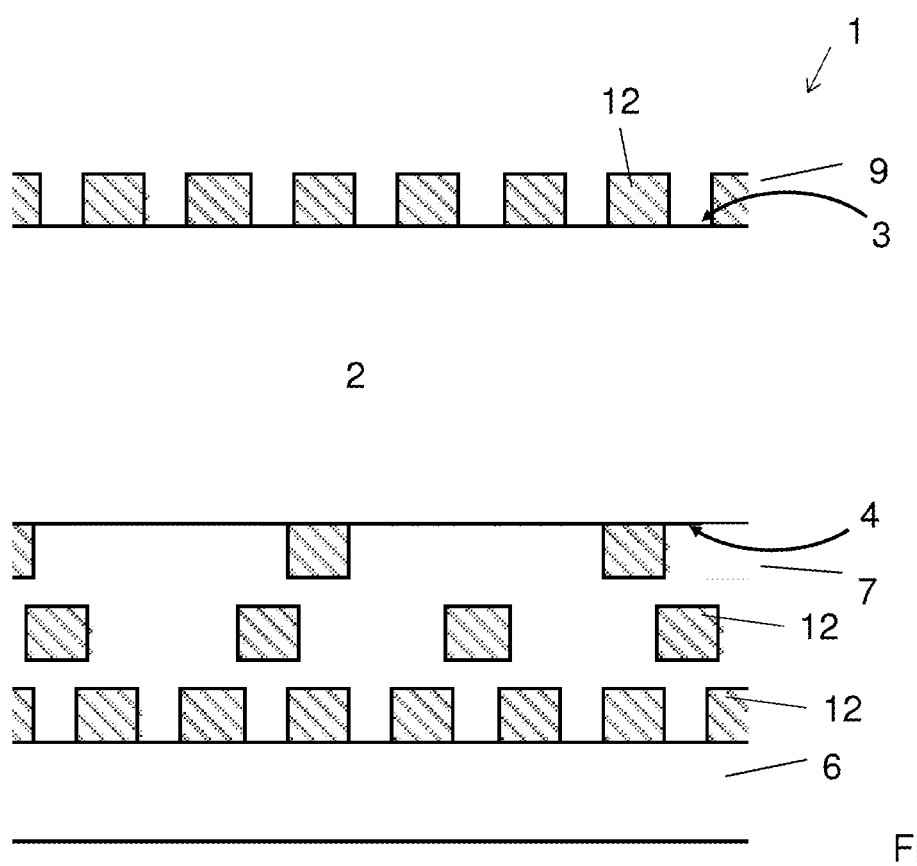
FIG. 6 shows a cross-sectional view of thin-film photovoltaic cell having a back side multiple layer grating and a front side single layer grating which are configured to provide resonance for a particular wavelength.

As shown in the embodiment of FIG. 6, by using the reflective and transmission characteristics of the gratings layers an effective band pass filter can be assigned that allows a narrow wavelength range to resonate within the absorbing layer 2, such that an incoming light beam having a specific wavelength range can become trapped inside the absorbing layer 2 if the front side 3 of the absorbing layer 2 is provided with a further grating layer 9 (second grating layer) as well.

Figure 7:
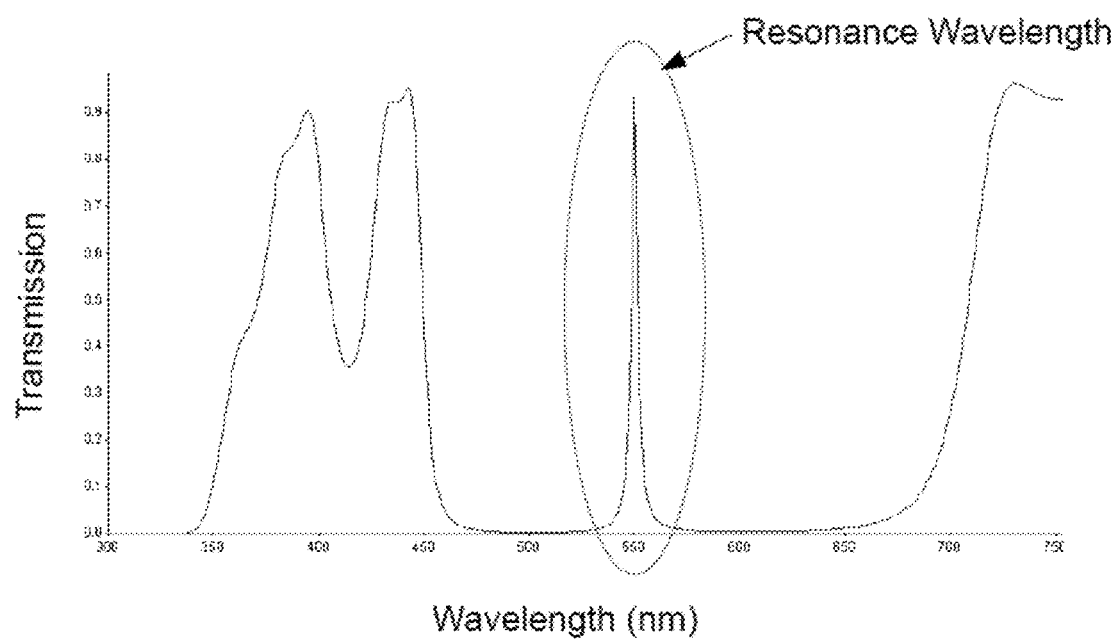
FIG. 7 shows a wavelength transmission diagram illustrating the reflectivity of the grating structure of FIG. 6.

In FIG. 7 it is shown that due to interference at the configuration of FIG. 6 only a certain frequency of radiation will be sustained by the resonator while other frequencies are suppressed due to destructive interference.

Figure 8:
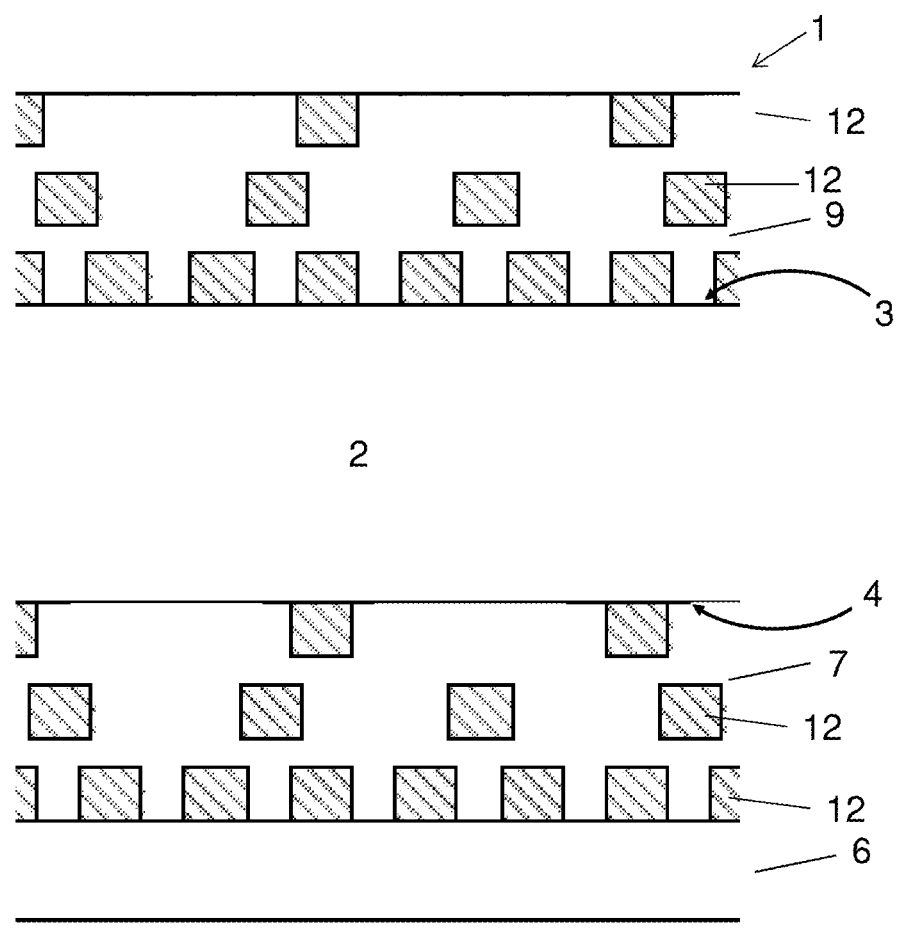
FIG. 8 shows a cross-sectional view of thin-film photovoltaic cell having a back side multiple layer grating and a front side multiple layer grating which are configured to provide resonance for a number of wavelengths.

In FIG. 8 it is shown that the photovoltaic device 1 of FIG. 1 can be further applied with multiple gratings in the second grating layer 9, so that multiple grating layers 7, 9 are both provided on the front side 3 and the back side 4 of the absorbing layer 2. Hence, this resonance effect can be extended to multiple wavelengths so that multiple resonances are provided.

By providing multiple grating layers on the front and the back side of the absorbing layer 2 a multiple resonance for multiple wavelengths can be achieved.

Figure 9:
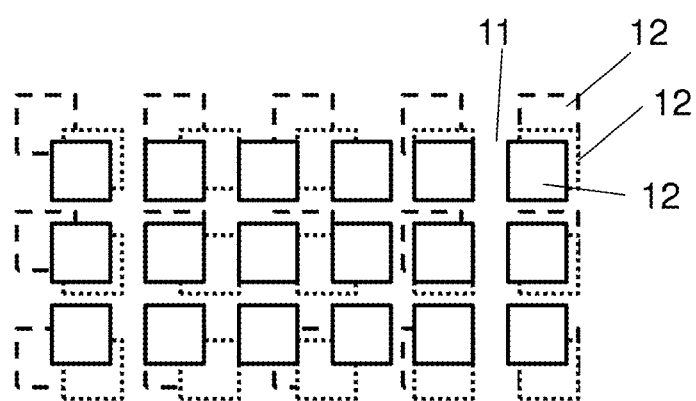
FIG. 9 shows a top view on a front side multiple layer grating of a thin-film photovoltaic cell wherein the multiple grating structures have different spacings to provide multiple resonances for multiple wavelength ranges.

In FIG. 9, a top view on the front side multiple grating layer 9 is shown, which illustrates grating layers each of which has grating structures of the same size but different spacings. However, to adapt the reflective and transmission characteristics apart from the spacing also the height (thickness) of the grating structures of each layer and their dimensions in x and z-direction can be adapted. According to this understanding, also rectangular or otherwise shaped grating structures (viewed from a direction perpendicular to the extension plane) can be used instead of mere square grating structures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A photovoltaic cell, comprising:
an absorbing layer comprising amorphous silicon configured to generate electron-hole pairs from incident photons of incoming light, wherein the absorbing layer includes a back side which is on a side facing a support substrate;
a first grating layer arranged at a first surface of the absorbing layer which is opposite to a second surface of the absorbing layer from which light is incident;
a silver reflective layer arranged at the back side of the absorbing layer between the absorbing layer and the supporting substrate; and
a second grating layer arranged at the second surface of the absorbing layer which is opposite to the first surface of the absorbing layer,
wherein each of the first grating layer and the second grating layer comprises at least one grating extending along its corresponding surface, wherein the at least one grating comprises grating structures which are dimensioned to provide a reflectivity for light incident through the absorbing layer back into the absorbing layer; and each of the first grating layer and the second grating layer comprises one or more grating layers configured as a multiple grating layer comprising a plurality of gratings configured to provide wavelength ranges of reflectivity which overlap each other, adjoin each other, or both, wherein at least one layer of the one or more grating layers comprises silicon grating structures embedded in a silicon dioxide support layer.

2. The photovoltaic cell of claim 1, wherein the one or more grating layers of the first grating layer comprise a plurality of gratings stacked in a direction perpendicular to the first surface of the absorbing layer.

3. The photovoltaic cell of claim 2, wherein the plurality of gratings comprises grating structures with stacked gratings having different dimensions with respect to their width, spacing and their height so as to provide improved reflectivity in a wavelength range defined by the dimensions of the grating layers to allow different ranges of wavelengths to be reflected into the absorbing layer.

4. The photovoltaic cell of claim 3, wherein a predetermined wavelength range can be absorbed by the absorbing layer.

5. The photovoltaic cell of claim 4, wherein the reflectivity of the first grating layer is adapted to a predetermined wavelength range, wherein the first grating layer comprises an average absorption rate for the predetermined wavelength range in the absorbing layer which is lower than the absorption rate in the absorbing layer for all wavelengths of the incident photons.

6. The photovoltaic cell of claim 1, wherein the one or more grating layers of the second grating layer comprise a plurality of gratings stacked in a direction perpendicular to the second surface of the absorbing layer.

7. The photovoltaic cell of claim 6, wherein the gratings of the second grating layer each have grating structures which differ in their dimensions to allow different ranges of wavelength to enter the absorbing layer thereby allowing a resonance between the respective gratings of the first and second grating layer.

8. The photovoltaic cell of claim 1, wherein the grating structures of the one or more grating layers differ in at least one of spacing, thickness, size in at least one direction parallel to the first or second surface, respectively, and shape.

9. A method of forming a photovoltaic cell, the method comprising:
configuring an absorbing layer comprising amorphous silicon to generate electron-hole pairs from incident photons of incoming light, wherein the absorbing layer includes a back side which is on a side facing a support substrate;
arranging a silver reflective layer at the back side of the absorbing layer between the absorbing layer and the supporting substrate;
arranging a first grating layer at a first surface of the absorbing layer which is opposite to a second surface of the absorbing layer from which light is incident; and
forming a second grating layer at the second surface of the absorbing layer,
wherein each of the first grating layer and the second grating layer comprises at least one grating extending along its corresponding surface, wherein the at least one grating comprises grating structures dimensioned to provide a reflectivity for light incident through the absorbing layer back into the absorbing layer, wherein each of the first grating layer and the second grating layer comprises one or more grating layers having a plurality of gratings configured to provide wavelength ranges of reflectivity which overlap each other, adjoin each other, or both, and wherein at least one layer of the one or more grating layers comprises silicon grating structures embedded in a silicon dioxide support layer.

10. The method of claim 9, further comprising forming the first grating layer with one or more grating layers having a plurality of gratings stacked in a direction perpendicular to the first surface of the absorbing layer.

11. The method of claim 10, wherein the plurality of gratings comprises grating structures with stacked gratings having different dimensions with respect to their width, spacing and their height so as to provide improved reflectivity in a wavelength range defined by the dimensions of the grating layers to allow different ranges of wavelengths to be reflected into the absorbing layer.

12. The method of claim 11, wherein a predetermined wavelength range can be absorbed by the absorbing layer.

13. The method of claim 12, wherein the reflectivity of the first grating layer is adapted to a predetermined wavelength range, wherein the first grating layer comprises an average absorption rate for the predetermined wavelength range in the absorbing layer which is lower than the absorption rate in the absorbing layer for all wavelengths of the incident photons.

14. The method of claim 9, further comprising forming the second grating layer with one or more grating layers having a plurality of gratings stacked in a direction perpendicular to the second surface of the absorbing layer.

15. The method of claim 14, wherein the gratings of the second grating layer each have grating structures which differ in their dimensions to allow different ranges of wavelength to enter the absorbing layer thereby allowing a resonance between the respective gratings of the first and second grating layer.

16. The method of claim 9, wherein the grating structures of the one or more grating layers differ in at least one of spacing, thickness, size in at least one direction parallel to the first or second surface, respectively, and shape.

* * * * *